United States Patent
Chan et al.

(10) Patent No.: US 12,094,707 B2
(45) Date of Patent: Sep. 17, 2024

(54) PLASMA ENHANCED CVD WITH PERIODIC HIGH VOLTAGE BIAS

(71) Applicant: Applied Materials, Inc., Santa Clara, CA (US)

(72) Inventors: Kelvin Chan, San Ramon, CA (US); Travis Koh, Sunnyvale, CA (US); Simon Huang, Campbell, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/070,821

(22) Filed: Oct. 14, 2020

(65) Prior Publication Data

US 2021/0028012 A1    Jan. 28, 2021

Related U.S. Application Data (62) Division of application No. 15/965,621, filed on Apr. 27, 2018, now Pat. No. 10,840,086.

(51) Int. Cl.
| | |
|---|---|
| H01L 21/02 | (2006.01) |
| C23C 16/26 | (2006.01) |
| C23C 16/50 | (2006.01) |
| C23C 16/52 | (2006.01) |

(52) U.S. Cl.
CPC ........ *H01L 21/02274* (2013.01); *C23C 16/26* (2013.01); *C23C 16/52* (2013.01); *C23C 16/50* (2013.01)

(58) Field of Classification Search
CPC ... H01L 21/02274; C23C 16/26; C23C 16/52; C23C 16/50
USPC .................................. 118/723 R, 715–733
See application file for complete search history.

(56) References Cited

U.S. PATENT DOCUMENTS

| | | | |
|---|---|---|---|
| 5,160,397 A | 11/1992 | Doki et al. | |
| 6,071,797 A | 6/2000 | Endo et al. | |
| 2001/0048980 A1 | 12/2001 | Kishimoto et al. | |
| 2002/0086260 A1* | 7/2002 | Shang | H01L 21/67109 432/247 |

(Continued)

FOREIGN PATENT DOCUMENTS

| | | |
|---|---|---|
| CN | 101110347 A | 1/2008 |
| CN | 101122015 A | 2/2008 |

(Continued)

OTHER PUBLICATIONS

International Preliminary Report on Patentability from PCT/US2019/024430 mailed Nov. 5, 2020, 8 pgs.

(Continued)

*Primary Examiner* — Charlee J. C. Bennett
(74) *Attorney, Agent, or Firm* — Schwabe, Williamson & Wyatt, P.C.

(57) ABSTRACT

Embodiments include a method of processing a substrate. In an embodiment, the method comprises flowing one or more source gasses into a processing chamber, and inducing a plasma from the source gases with a plasma source that is operated in a first mode. In an embodiment, the method may further comprise biasing the substrate with a DC power source that is operated in a second mode. In an embodiment, the method may further comprise depositing a film on the substrate.

12 Claims, 5 Drawing Sheets

(56) References Cited

U.S. PATENT DOCUMENTS

| | | | |
|---|---|---|---|
| 2006/0194516 A1* | 8/2006 | Kamigori | H01L 21/6875 451/41 |
| 2007/0119373 A1 | 5/2007 | Kumar et al. | |
| 2011/0236806 A1* | 9/2011 | Ouye | G03F 1/80 430/5 |
| 2013/0260057 A1 | 10/2013 | Wu et al. | |
| 2014/0251956 A1* | 9/2014 | Jeon | H01J 37/32706 156/345.44 |
| 2014/0273487 A1* | 9/2014 | Deshmukh | H01L 21/6875 156/345.43 |
| 2015/0226540 A1* | 8/2015 | Rajagopalan | C23C 16/5096 356/402 |
| 2015/0325418 A1* | 11/2015 | Gil Rostra | C23C 14/081 501/153 |
| 2016/0011526 A1* | 1/2016 | Xie | G03F 7/2022 355/53 |
| 2016/0079037 A1 | 3/2016 | Hirano et al. | |
| 2016/0203971 A1 | 7/2016 | Tsiang et al. | |
| 2017/0016118 A1 | 1/2017 | Rajagopalan et al. | |
| 2017/0250056 A1 | 8/2017 | Boswell et al. | |
| 2017/0253961 A1 | 9/2017 | Tachibana et al. | |
| 2019/0088518 A1* | 3/2019 | Koh | C23C 16/505 |
| 2019/0088520 A1* | 3/2019 | Kraus | H01J 37/32706 |

FOREIGN PATENT DOCUMENTS

| | | |
|---|---|---|
| CN | 101552187 A | 10/2009 |
| CN | 105789040 A | 7/2016 |
| CN | 106057636 A | 10/2016 |
| JP | H06314660 A | 11/1994 |
| JP | H07118860 A | 5/1995 |
| JP | 2012-104382 A | 5/2012 |
| JP | 2018-508980 A | 3/2018 |
| KR | 10-2017-0101237 | 9/2017 |
| TW | 201404927 | 2/2014 |
| TW | 201742949 | 12/2017 |
| WO | WO 2014/066541 | 5/2014 |
| WO | WO 2016/111798 A | 7/2016 |

OTHER PUBLICATIONS

Official Letter from Taiwan Patent Application No. 108111626 dated Jul. 6, 2021, 8 pgs.
International Search Report and Written Opinion from PCT/US2019/024430 mailed Jul. 11, 2019, 12 pgs.
Non-Final Office Action from U.S. Appl. No. 15/965,621 mailed Apr. 2, 2020, 15 pgs.
Notice of First Office Action from Chinese Patent Application No. 201980028205.1 dated Mar. 18, 2022, 14 pgs.
Notice of Second Office Action from Chinese Patent Application No. 201980028205.1 dated Jun. 24, 2022, 11 pgs.
Notice of Preliminary Rejection from Korean Patent Application No. 10-2020-7033826 dated Mar. 28, 2022, 5 pgs.
Notice of Reasons for Rejection from Japanese Patent Application No. 2020-559532 dated Jan. 27, 2022, 4 pgs.
Jian-Sheng Pan et al., "Heat Treatment Technology" Beijing: Higher Education Press, Jan. 31, 2009, 5 pages.
Decision of Rejection from Chinese Patent Application No. 201980028205.1 dated Oct. 24, 2022, 11 pgs.
Notice of Reasons for Rejection from Japanese Patent Application No. 2020-559532 dated Aug. 26, 2022, 6 pgs.
Notice of Reasons for Rejection from Japanese Patent Application No. 2020-559532 dated Mar. 17, 2023, 6 pgs.
Final Rejection from Korean Patent Application No. 10-2020-7033826 dated Sep. 21, 2022, 5 pgs.
Decision of Rejection from Japanese Patent Application No. 2020-559532 dated Jun. 30, 2023, 4 pgs.
Notice of Second Final Rejection from Korean Patent Application No. 10-2020-7033826 dated Aug. 28, 2023, 6 pgs.
IPTAB Decision from Korean Patent Application No. 10-2020-7033826, dated Jun. 28, 2024, 18 pgs.

* cited by examiner

PLASMA ENHANCED CVD WITH PERIODIC HIGH VOLTAGE BIAS

CROSS-REFERENCE TO RELATED APPLICATIONS

This application is a Divisional of U.S. patent application Ser. No. 15/965,621, filed on Apr. 27, 2018, the entire contents of which are hereby incorporated by reference herein.

BACKGROUND

1) Field

Embodiments relate to the field of semiconductor processing equipment and, in a particular embodiment, to a processing tool for plasma enhanced chemical vapor deposition with a pulsed high voltage bias applied to the substrate.

2) Description of Related Art

Carbon films are typically formed with plasma enhanced chemical vapor deposition (CVD) processes. The plasma generated in plasma enhanced CVD processes may be a capacitively coupled plasma (CCP), inductively coupled plasma (ICP), a microwave plasma, or the like. However plasma enhanced CVD processes that use plasma sources such as these have several drawbacks. One drawback is that plasma enhanced CVD typically needs to be implemented at high substrate temperatures in order to form high quality films. For example, the substrate temperature is typically greater than 500° C.

Another drawback of existing plasma enhanced CVD processes is that the density of the plasma and the maximum ion energy of the plasma both increase with increasing plasma power. Particularly, the plasma density and the maximum ion energy are not independent, and the maximum ion energy is not large. For example, the typical ion energy in such plasma enhanced CVD processes is typically 1,000 eV or less. Additionally, plasma enhanced CVD has a wide ion energy distribution due to the oscillating RF sheath potential. Accordingly, optimization of a deposition process by control of the population of ions at a given ion energy is not possible. The wide distribution of ion energies makes it difficult to predict the process results. Accordingly, it is difficult to tailor a plasma enhanced CVD process to provide desirable high quality film properties.

SUMMARY

Embodiments include a method of processing a substrate. In an embodiment, the method comprises flowing one or more source gasses into a processing chamber, and inducing a plasma from the source gases with a plasma source that is operated in a first mode. In an embodiment, the method may further comprise biasing the substrate with a DC power source that is operated in a second mode. In an embodiment, the method may further comprise depositing a film on the substrate.

Embodiments may also include a method of processing a substrate that comprises flowing one or more source gasses into a processing chamber and inducing a plasma from the source gases with a plasma source. In an embodiment, the method may also comprise biasing the substrate with a pulsed DC power source. In an embodiment, the pulsed DC power source provides pulses of at least a first voltage and a second voltage. In an embodiment, the method further comprises depositing a film on the substrate.

Embodiments may also comprise a processing tool for depositing a film on a workpiece. In an embodiment, the processing tool comprises a chamber body. In an embodiment, the processing tool further comprises a plasma source. In an embodiment, the plasma source is operated in a first mode, and the plasma source induces a plasma from one or more processing gasses flown into the chamber body. In an embodiment, the processing tool further comprises a chuck in the chamber body for supporting the workpiece. In an embodiment the chuck is electrically coupled to a DC power source, and the DC power source is operated in a second mode. In an embodiment, the film comprises constituents of only the one or more processing gasses.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Devices in accordance with embodiments described herein include a plasma enhanced chemical vapor deposition (CVD) processing tool. In a particular embodiment, a chuck of the plasma enhanced CVD processing tool is biased with a pulsed high voltage DC source. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, traditional plasma enhanced chemical vapor deposition (PECVD) processes do not provide the ability to tailor the process to provide high quality film properties. High quality film properties may refer to high density, high refractive index, and low film stress. Accordingly, embodiments described herein may include a PECVD processing tool that further includes a pulsed DC bias that is applied to the substrate being processed. The use of a pulsed DC bias allows for improved film properties. For example, a carbon film formed with processes described herein may have a density of 2.0 g/cm$^3$ or greater, a refractive index of 2.0 or greater, and a film stress magnitude less than 500 MPa. Such film properties may also be obtained with low temperature processing, such as less than approximately 200° C.

A pulsed DC bias that applies a periodic voltage across the plasma sheath over the substrate allows for ions from the plasma to be accelerated to the substrate at high energies (e.g., up to 20 keV). This provides an in-situ implant effect that results in an increase in the film density. Furthermore, it is to be appreciated that the pulsed DC bias of the plasma sheath may ensure that substantially all of the ions impacting the substrate are at the same energy. This is a significant improvement over an oscillating RF sheath potential which, as described above, results in a distribution of ion energies. Accordingly, the ion energy distribution may be tuned to a single energy (e.g., from approximately 1 keV to 20 keV). For example, a pulse voltage of 6 kV may result in a flux of predominantly 6 keV ions to the substrate. In some embodiments, pulse voltages may be alternated between a first voltage and a second voltage to provide a specific outcome in the film properties. For example a first pulse voltage of 2 kV and a second pulse voltage of 8 kV may be alternated to obtain desired film properties.

Figure 1:
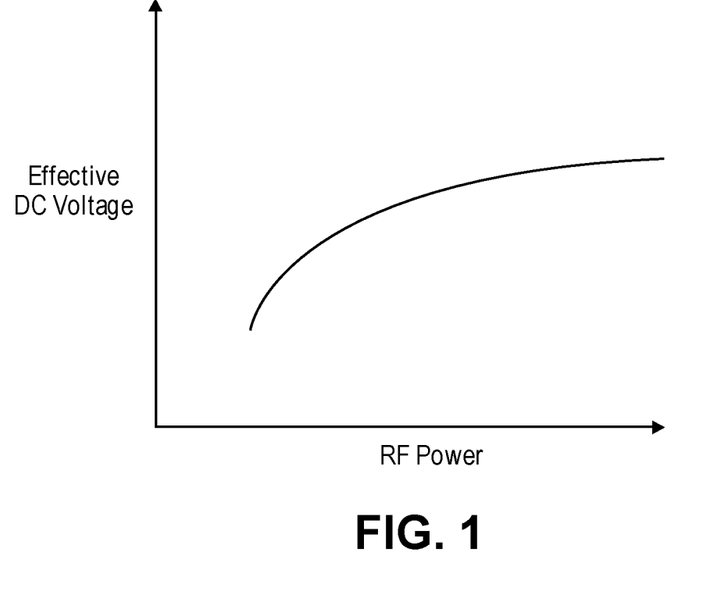
FIG. 1 is a graph of RF power and the effective DC voltage, in accordance with an embodiment.

While a bias may be applied to a substrate with an RF source (i.e., to provide an effective DC bias on a substrate) it has been found that a pulsed DC power source, such as those described herein provide improved film properties. Particularly, the use of an RF source to bias a substrate requires much more power to obtain the desired effective DC bias. As illustrated in FIG. 1, as the RF power increases, the effective DC voltage flattens out. Accordingly, significantly more RF power is needed to obtain the high DC voltages (e.g., greater than 1 kV) disclosed herein. In addition to the cost of running a process at such high powers, the majority of the power ends up heating the substrate. As such, low temperature PECVD processes, such as those disclosed herein become impracticable.

Figure 2:
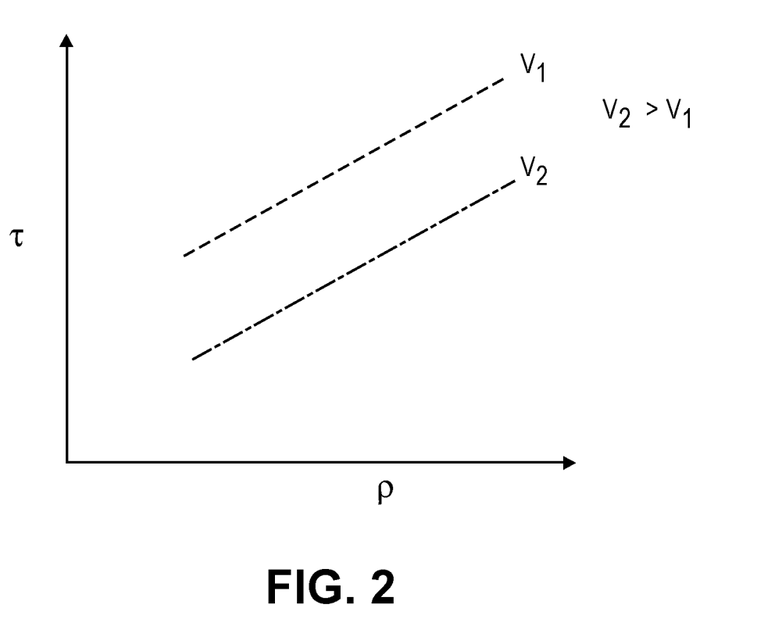
FIG. 2 is a graph of film density and film stress at two different voltages, in accordance with an embodiment.

In films produced by PECVD there is a tradeoff between film quality and film stress. An example of the relationship is shown in FIG. 2. As illustrated, as the density of the film ρ increases, so does the stress of the film τ. Accordingly, in order to get high quality films (i.e., films with high density ρ) there is a tradeoff since the film stress τ also increases. However, the magnitude of the film stress τ may be reduced by applying a DC voltage to the substrate. For example, the line representing $V_2$ has a lower magnitude of the film stress τ for a given film density ρ than the line representing $V_1$, where $V_2$ is greater than $V_1$.

Figure 3:
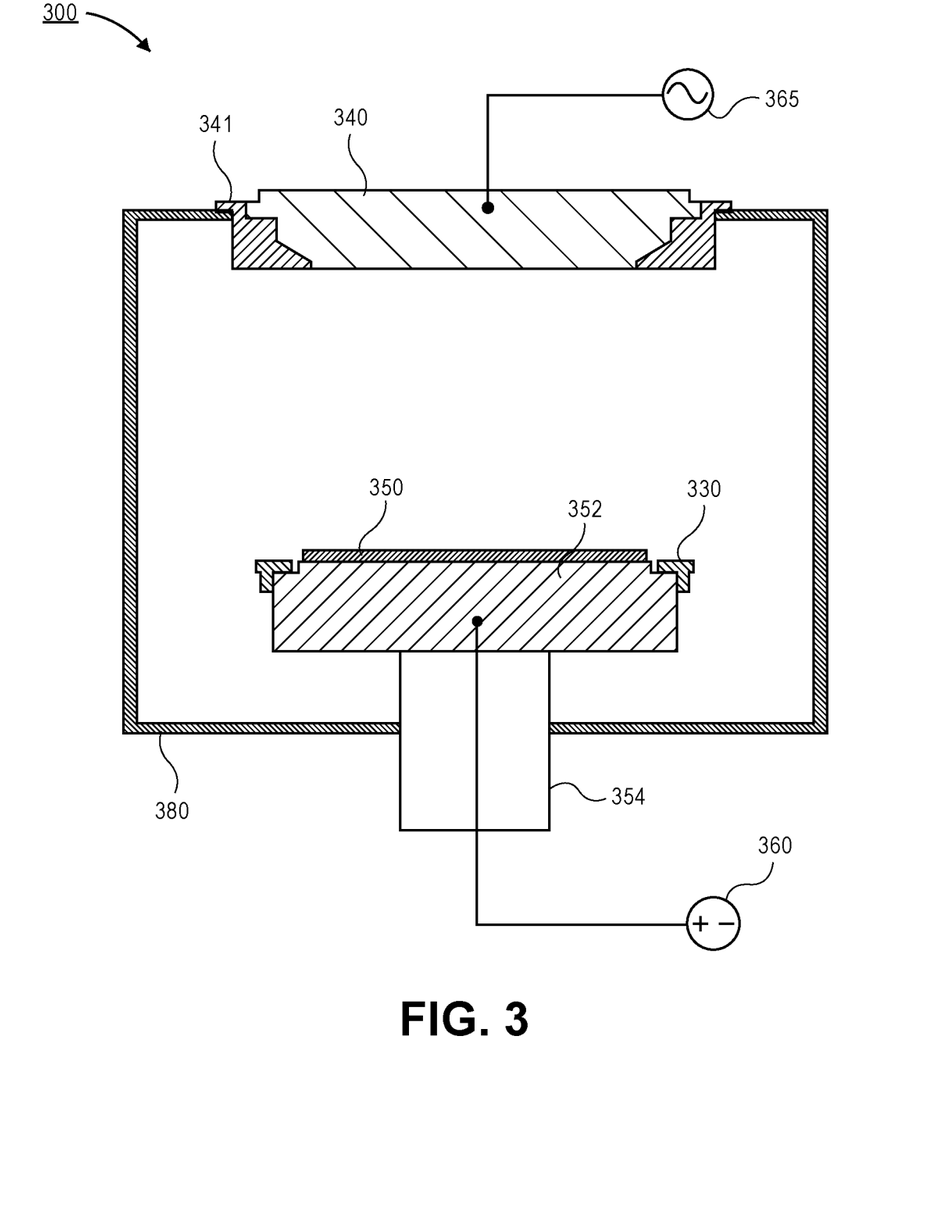
FIG. 3 is a cross-sectional illustration of a processing tool that includes a chuck that is electrically coupled to a DC source, in accordance with an embodiment.

Referring now to FIG. 3, a cross-sectional illustration of a processing tool 300 is shown, in accordance with an embodiment. In an embodiment, the processing tool 300 may include a chamber body 380. The chamber body 380 may be any suitable vacuum chamber of any size to accommodate the processing of one or more substrates 350. In an embodiment, the chamber body 380 may include a lid 341. In an embodiment, the lid 341 may support a gas distribution plate 340, such as a showerhead. In an embodiment, the gas distribution plate 340 may be electrically coupled to an RF source 365. In some embodiments, the RF source 365 may be electrically coupled to an electrode separate from the gas distribution plate 340. While not illustrated, it is to be appreciated that one or more exhaust ports may also be formed through the chamber body 380. In an embodiment, a pressure within the chamber body 380 may be maintained between approximately 1 mTorr and 500 mTorr, depending on the process being implemented.

In an embodiment, substrates 350 in the chamber body 380 may be supported by a chuck 352. The chuck 352 may be an electrostatic chuck in some embodiments. In an embodiment, the chuck 352 may include heating and/or cooling systems to provide a desired substrate temperature during processing. For example, the heating and/or cooling system may maintain a substrate temperature that is below 800° C. In some embodiments the substrate temperature may be maintained below 200° C. Embodiments may include a substrate temperature between approximately −250° C. and 800° C. A process kit 330 may be coupled to the chuck 352 around an outer edge of the substrate 350. In an embodiment, the chuck 352 may be coupled to a pedestal 354 that includes a port out of the chamber body 380.

In an embodiment, the chuck 352 may be electrically coupled to a DC power source 360. In an embodiment, the DC power source 360 may be a pulsed DC power source. Embodiments may include a pulsed DC power source 360 that has a pulse frequency between approximately 1 kHz and 100 kHz. In an embodiment, the DC power source 360 may be between −20 kV and 20 kV. Embodiments may also include a DC power source 360 that is tunable to different voltages between approximately −20 kV and 20 kV. In some embodiments, a plurality of pulsed DC power sources 360 may be electrically coupled to the chuck 352. In an embodiment, the pulsed DC power source may have a duty cycle between 1% and 100%. For example, at a 1% duty cycle for a 1 kHz frequency, the DC power is on for 0.01 seconds and the DC power is off for 0.99 seconds. In some embodiments, the DC power may always be on.

In an embodiment, the DC voltage from the power source 360 may be coupled to the substrate via electrical contact pins, a contact mesh, direct contact with a biased surface of the chuck 352 or capacitively coupled through the chuck 352. More detailed explanations of the various coupling embodiments are described below with respect to FIGS. 4A-4C.

It is to be appreciated that the processing tool 300 described above is exemplary in nature, and that many different processing tool configurations may be used in conjunction with embodiments described herein. For example, the processing tool 300 may include a capacitively coupled plasma (CCP) source, an inductively coupled plasma (ICP) source, or a microwave plasma source. Embodiments also include processing tool configurations where the plasma is top launched, bottom launched, or both.

In an embodiment, the DC biasing of the plasma sheath by the pulsed DC power source 360 may be implemented with the source plasma being in a continuous wave mode, synchronized with the DC bias pulsing, off-synchronized with DC bias pulsing, or in a pulsed mode while keeping the DC biasing always on. In an embodiment, a duty cycle of the DC bias is matched with a duty cycle of the plasma source. In an embodiment, a duty cycle of the plasma source is different than a duty cycle of the DC bias. For example, the DC bias and the source plasma may be on at the same time, and one of the DC bias or the source plasma turns off before the other. In an embodiment, the source plasma and the pulsed DC bias may have different frequencies and the same duty cycle. In an embodiment, the source plasma and the pulsed DC bias may have different frequencies and different duty cycles.

Figure 4A:
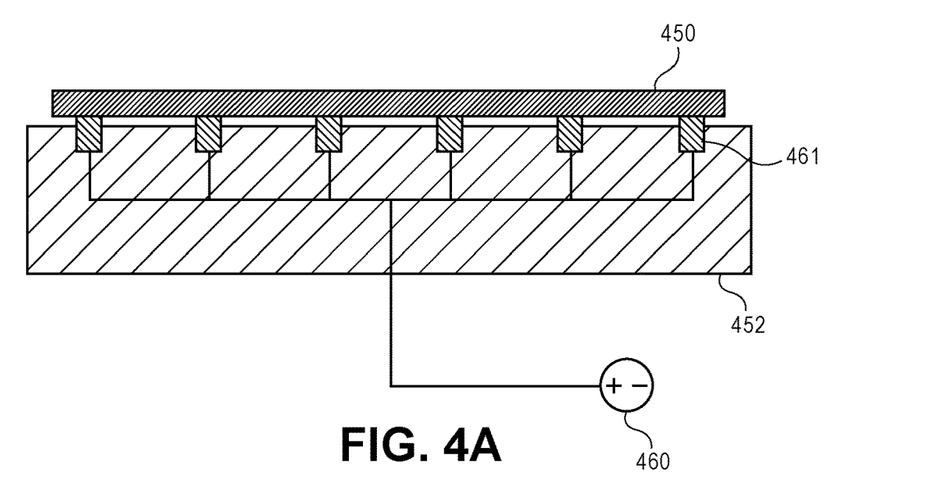
FIG. 4A is a cross-sectional illustration of a chuck that includes pins for contacting the backside surface of a substrate, where the pins are electrically coupled to a DC source, in accordance with an embodiment.

Referring now to FIG. 4A, a cross-sectional illustration of a chuck 452 that is supporting a substrate 150 is shown, in accordance with an embodiment. In the illustrated embodiment, the chuck 452 may be electrically coupled to a pulsed DC power source 460. In a particular embodiment, the chuck 452 may comprise a plurality of conductive pins 461. The plurality of conductive pins 461 may be electrically coupled to the DC power source 460. In an embodiment, the conductive pins 461 may directly contact a backside surface of the substrate 450. Accordingly, the DC bias pulsing may be directly coupled to the substrate 450. In an embodiment, the pins 461 may be formed with any suitable conductive material. In an embodiment the pins may be aluminum. Embodiments may also include conductive pins 461 that comprise a plurality of material layers.

In the illustrated embodiment, the conductive pins 461 are shown as extending above a top surface of the chuck 452. In such an embodiment, the substrate 450 may be supported entirely by the conductive pins 452. In additional embodiments, a top surface of the conductive pins 461 may be substantially coplanar with a top surface of the chuck 452. In such embodiments, the substrate 450 may be supported by the conductive pins 461 and the chuck 452.

While the conductive pins 461 are illustrated as having rectangular cross-sections, it is to be appreciated embodiments may include conductive pins with any shape. In some embodiments, the conductive pins 461 may be substantially planar. Such embodiments may be considered conductive pads instead of pins. Furthermore, embodiments may include a plurality of conductive traces formed over the surface of the chuck 452 that are electrically coupled to the DC power source 460.

Figure 4B:
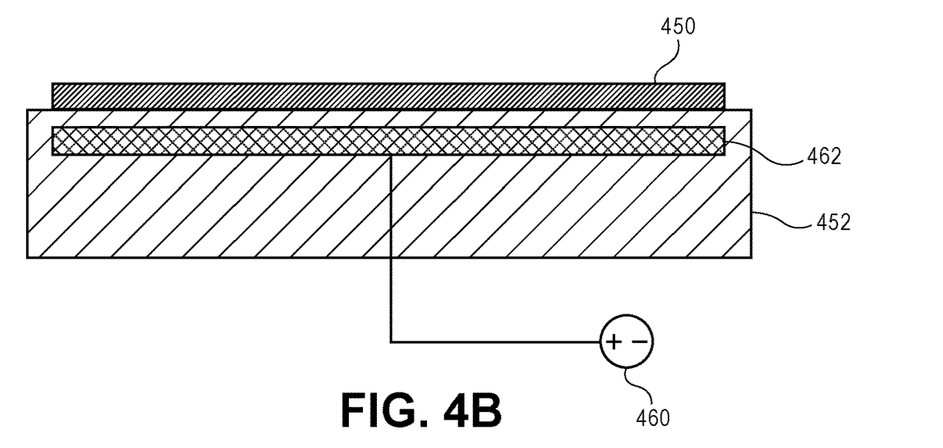
FIG. 4B is a cross-sectional illustration of a chuck that includes an embedded conductive mesh that is electrically coupled to a DC source, in accordance with an embodiment.

Referring now to FIG. 4B, a cross-sectional illustration of a chuck 452 that is supporting a substrate 150 is shown, in accordance with an embodiment. In the illustrated embodiment, a conductive mesh 462 that is embedded within the chuck 452 may be electrically coupled to the DC power source 460. In such embodiments, the conductive mesh 462 may be electrically coupled to a substrate 450 that is supported by the chuck 452. Embedding the conductive mesh 462 may provide advantages over other embodiments because the conductive mesh is entirely protected from the processing environment. Additionally, embedding the conductive mesh 462 allows for the substrate 450 to be entirely supported by the chuck 452 without any other components between them.

In an embodiment, the conductive mesh 462 may comprise any suitable conductive material or conductive materials. In an embodiment, the conductive mesh may be copper, aluminum, or the like. In an embodiment, the conductive mesh 462 may have any desired density. In some embodiments, the conductive mesh 462 may optionally be a conductive plate and/or a network of conductive traces embedded within the chuck 452.

Figure 4C:
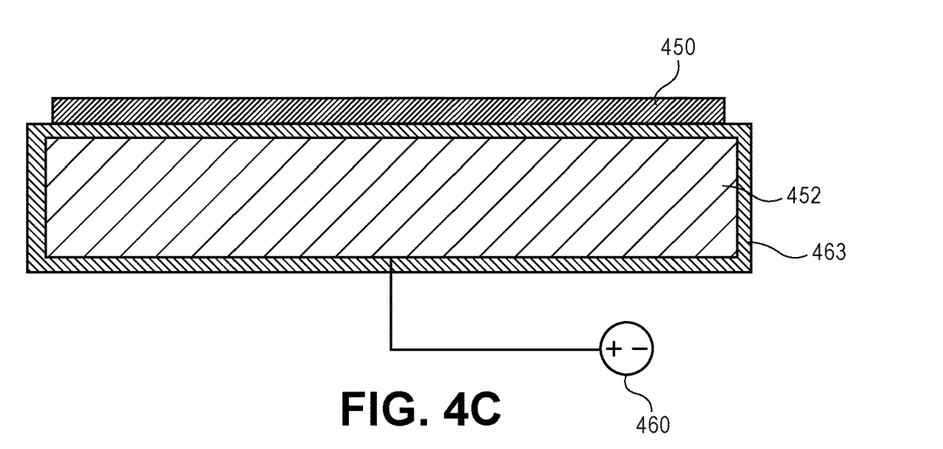
FIG. 4C is a cross-sectional illustration of a chuck that includes a conductive coating that is electrically coupled to a DC source, in accordance with an embodiment.

Referring now to FIG. 4C, a cross-sectional illustration of a chuck 452 that is supporting a substrate 150 is shown, in accordance with an embodiment. In the illustrated embodiment, a conductive coating 463 is formed over a surface of the chuck 452. The conductive coating 463 may be electrically coupled to the DC power source 460. In an embodiment, the conductive coating 463 may be any suitable conductive material, or layers of conductive materials. In an embodiment, the conductive coating 463 may comprise aluminum.

In the illustrated embodiment the conductive coating 463 is formed over all surfaces of the chuck 452. However, it is to be appreciated that the conductive coating 463 may be formed over some of the surfaces of the chuck 452. For example, the conductive coating 463 may optionally be formed over only a top surface of the chuck 452. In such embodiments, the substrate 450 may rest entirely on the conductive coating 463. The conductive coating 463 may electrically couple the DC power source 460 to the substrate 450.

In additional embodiments, the conductive coating may be omitted when the chuck comprises conductive material. For example, conductive material of the chuck 452 may be electrically coupled to the DC power source 460. In such embodiments, the chuck 452 itself may electrically couple the DC power source 460 to the substrate 450.

Figure 5:
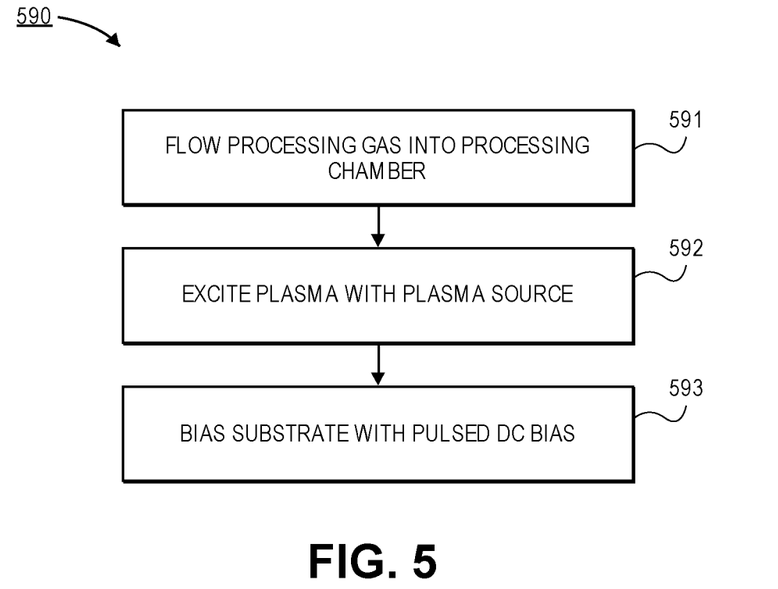
FIG. 5 is a process flow diagram of a substrate processing recipe that uses a DC biased chuck, in accordance with an embodiment.

Referring now to FIG. 5, a process flow diagram for a plasma enhanced chemical vapor deposition (PECVD) process 590 is shown in accordance with an embodiment. In an embodiment, PECVD process 590 may be implemented with a processing tool that includes a pulsed DC power source for biasing the substrate. For example, processing tool 300 described above may be used to implement PECVD process 590.

In an embodiment, PECVD process 590 may comprise operation 591 which includes flowing a processing gas into the processing chamber. It is to be appreciated that one or more processing gases may be flown into the processing chamber to provide the desired feed stock to form a particular film. For example, in a PECVD process 590 for forming a carbon film, the processing gasses may include one or more of acetylene, methane, propylene, ethylene, cyclopropane, ethane, propane, gases with the chemical formula $C_XH_Y$, and other carbon containing source gases. In embodiments where a silicon film is desired, the processing gasses may include one or more of silane, disilane, trisilane, tertrasilane, hydrogen, and any inert gas. In embodiments where a silicon oxide film is desired, the processing gasses may include one or more of silane, tetraethyl orthosilicate (TEOS), In embodiments where a nitride film is desired, the processing gasses may include one or more of silane, $NH_3$, $N_2$, $H_2$, and any inert gas.) In embodiments where a $CH_XF_Y$ film is desired, the processing gasses may include one or more fluorocarbons (to form $CH_XF_Y$ films). In embodiments where a metal or metal oxide film is desired, the processing gasses may include one or more metalorganic compounds. Embodiments may also include other source gasses needed to enable reactions, such as oxygen containing source gases, and/or inert gasses. In an embodiment, the film deposited on the substrate may comprise only constituents from the one or more source gasses. For example, the film formed is a distinct film that is deposited over the substrate and is not simply a surface modification of an existing film or material on the substrate.

Referring now to operation 592, the PECVD process 590 may include exciting a plasma in the processing chamber with a plasma source. In an embodiment the plasma source may be a CCP source, an ICP source, a microwave plasma source, or any other source. In an embodiment, the source plasma frequency may be between 100 kHz and 100 GHz. In an embodiment, the plasma source may be top launched, bottom launched, or both. As will be described below, the plasma source may be operated in a pulsed mode. When operating in a pulsed mode, it is to be appreciated that the frequency of the pulsing is a different frequency than the frequency of the electromagnetic radiation being emitted. For example, the pulsing frequency may be between 1 kHz and 100 kHz, and the electromagnetic radiation emitted by the source plasma may be between approximately 100 kHz and 100 GHz.

Referring now to operation 593, PECVD process 590 may include biasing a substrate with a pulsed DC bias. In an embodiment, the pulsed DC bias may be between approximately 1 kV and 20 kV. In an embodiment, the frequency of the pulsing may be between 1 kHz and 100 kHz. It is to be appreciated that the pulsed DC bias allows for the ion energies to be tailored to a specific level. For example, the use of a pulsed DC bias will result in a flux of ions towards the substrate that all have substantially the same ion energy. Furthermore, due to the high ion energies (e.g., up to approximately 20 keV) an ion-bombardment effect is obtained. The ion-bombardment effect results in films with higher densities, better optical properties, and relatively lower film stress. Additionally, the PECVD process 590 allows for independent control of ion energy and plasma density since the ion energy is derived primarily from the DC biasing.

In an embodiment, the plasma source may be operated in a first mode and the DC power source may be operated in a second mode. In an embodiment, the first mode comprises a first frequency and a first duty cycle, and the second mode is a pulsed mode that comprises a second frequency and a second duty cycle. In an embodiment the PECVD process 590 may comprise a first frequency that is equal to the second frequency, and a first duty cycle that is equal to the second duty cycle. In an embodiment, the PECVD process 590 may comprise a first frequency that is equal to the second frequency, and a first duty cycle that is different than the second duty cycle. In an embodiment, the PECVD process 590 may comprise a first frequency that is different than the second frequency, and the first duty cycle may be equal to the second duty cycle. In an embodiment, the PECVD process 590 may comprise a first frequency that is different than the second frequency, and the first duty cycle may be different than the second duty cycle. In an embodiment, the first and second duty cycles may be between 1% and 99%.

In an embodiment, the DC bias may be operated in a second mode that comprises pulsing and the source plasma may be operated in a first mode that comprises a continuous wave mode. In an embodiment, the DC bias pulsing may be operated with the source plasma being always on. In an embodiment, the DC bias pulsing may be operated with the source plasma being off-synchronized with DC bias pulsing. In an embodiment, the DC bias pulsing may be operated with the source plasma being in a pulsed mode while keeping the DC biasing always on.

According to an embodiment, PECVD process 590 may be implemented with low substrate temperatures. For example, PECVD process 590 may be implemented with a substrate temperature that is between approximately −250° C. and 800° C. In a particular embodiment, the substrate temperature may be less than 200° C. It is noted that such low temperature processes with an RF only plasma system are not able to form high quality films comparable to those enabled by embodiments described herein. For example, to improve the quality of an RF CCP film by increasing the maximum ion energy, a large increase in RF power is needed, as illustrated in FIG. 1. For example, to achieve an effective DC bias of 7.5 kV, it may require approximately 17 kW RF power. Because the source of power applied to the plasma will heat the substrate, such low temperature processes are not currently achievable with existing RF only PECVD processes.

Films formed in accordance with PECVD process 590 have demonstrated superior film qualities compared to similar PECVD processes without the use of a substrate that is pulsed with a DC bias. For example, a source gas of acetylene or methane to form a plasma between 2 mTorr and 15 mTorr, using a source with 100 W to 1,000 W (162 MHz top launched CCP) power with and without a 1 kV substrate bias from a pulsed DC power source was used to demonstrate the superior film quality of films formed in accordance with PECVD process 590. In the film without a DC bias, the refractive index was 1.9, the density was 1.5 g/cm$^3$, and the stress was −300 MPa. In the film formed in accordance with PECVD process 590, the refractive index was 2.5, the density was 2.0 g/cm$^3$, and the magnitude of the film stress was approximately 500 MPa. Particularly, it is noted that the improved film quality is at least in part attributable to the large flux of ions at a singular high ion energy that results in ion-bombardment at the surface of the substrate.

Embodiments described herein include PECVD processes that include the ability to precisely tune the ion energies. Accordingly, PECVD processes in accordance with embodiments described herein allow for the films to be formed with ion fluxes of alternating ion energies. An example of such a PECVD process 690 is described with respect to the flow diagram in FIG. 6.

Figure 6:
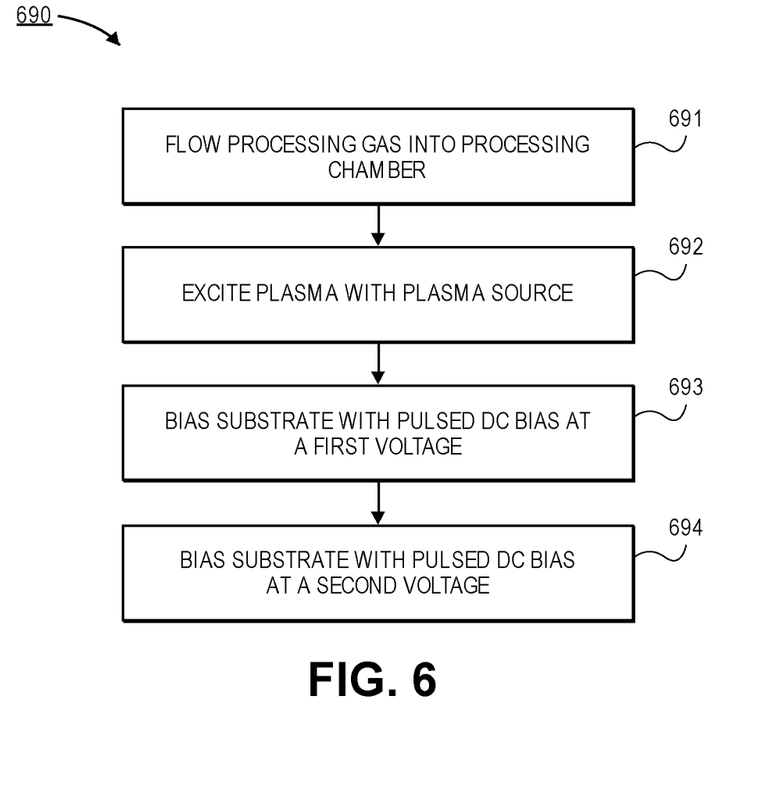
FIG. 6 is a process flow diagram of a substrate processing recipe that uses a DC biased chuck at more than one voltage, in accordance with an embodiment.

In an embodiment, PECVD process 690 may comprise operation 691 which includes flowing a processing gas into the processing chamber. It is to be appreciated that one or more processing gases may be flown into the processing chamber to provide the desired feed stock to form a particular film. For example, in a PECVD process 690 for forming a carbon film, the processing gasses may include one or more of acetylene, methane, or other carbon containing source gases. In embodiments where other films are desired, the processing gasses may include one or more of tetraethyl orthosilicate (TEOS) (to form a silicon or silicon oxide film), silane and nitrogen (to form SiN films), fluorocarbons (to form $CH_xF_y$ films), or metalorganic compounds (to form metal or metal oxide films). Embodiments may also include other source gasses needed to enable reactions, such as oxygen containing source gases, and/or inert gasses.

Referring now to operation 692, the PECVD process 690 may include exciting a plasma in the processing chamber with a plasma source. In an embodiment the plasma source may be a CCP source, an ICP source, a microwave plasma source, or any other source. In an embodiment, the source plasma frequency may be between 100 kHz and 100 GHz. In an embodiment, the plasma source may be top launched, bottom launched, or both.

Referring now to operation 693, PECVD process 690 may include biasing a substrate with a pulsed DC bias at a first voltage. In an embodiment, the first pulsed DC bias may be between approximately −20 kV and 20 kV. In an embodiment, the frequency of the pulsing may be between 1 kHz and 100 kHz. It is to be appreciated that the pulsed DC bias allows for the ion energies to be tailored to a specific level. For example, the use of a pulsed DC bias will result in a flux of ions towards the substrate that all have substantially the same first ion energy.

Referring now to operation 694, PECVD process 690 may include biasing a substrate with a pulsed DC bias at a second voltage. In an embodiment, the second pulsed DC bias may be between approximately −20 kV and 20 kV. In an embodiment, the frequency of the pulsing may be between 1 kHz and 100 kHz. It is to be appreciated that the pulsed DC bias allows for the ion energies to be tailored to a specific level. For example, the use of a pulsed DC bias will result in a flux of ions towards the substrate that all have substantially the same second ion energy. In an embodiment, the second voltage may be different than the first voltage. In an embodiment, the first voltage may be 2 kV and the second voltage may be 8 kV.

In an embodiment, the first pulsed DC voltage may be pulsed for a first period of time, and the second pulsed DC voltage may be pulsed for a second period of time. In some embodiments, the PECVD process 690 may end after the second period of time, without repeating the first pulsed DC voltage. In other embodiments, the pulsed DC voltage may be alternated between the first pulsed DC voltage and the second pulsed DC voltage any number of times. In an embodiment, more than two pulsed DC voltages may be used in a PECVD process 690. For example, a first pulsed DC voltage, a second pulsed DC voltage, and a third pulsed DC voltage may be used to bias a substrate during a PECVD process 690. It is to be appreciated that embodiments may also include a first voltage, a second voltage, a third voltage, etc. that is 0 V. For example, the first voltage may be between −20 kV and 20 kV and the second voltage may be 0 V.

It is to be appreciated that the PECVD processes described in embodiments herein may be operated in any sequence. For example, PECVD process 590 includes three distinct processing operations (591, 592, and 593)m and PECVD process 690 includes four distinct processing operations (691, 692, 693, and 694). However, it is to be appreciated that the processing operations may be implemented in any order, and do not have to be implemented sequentially. For example two or more of the processing operations may be implemented simultaneously, or at least partially simultaneously.

Figure 7:
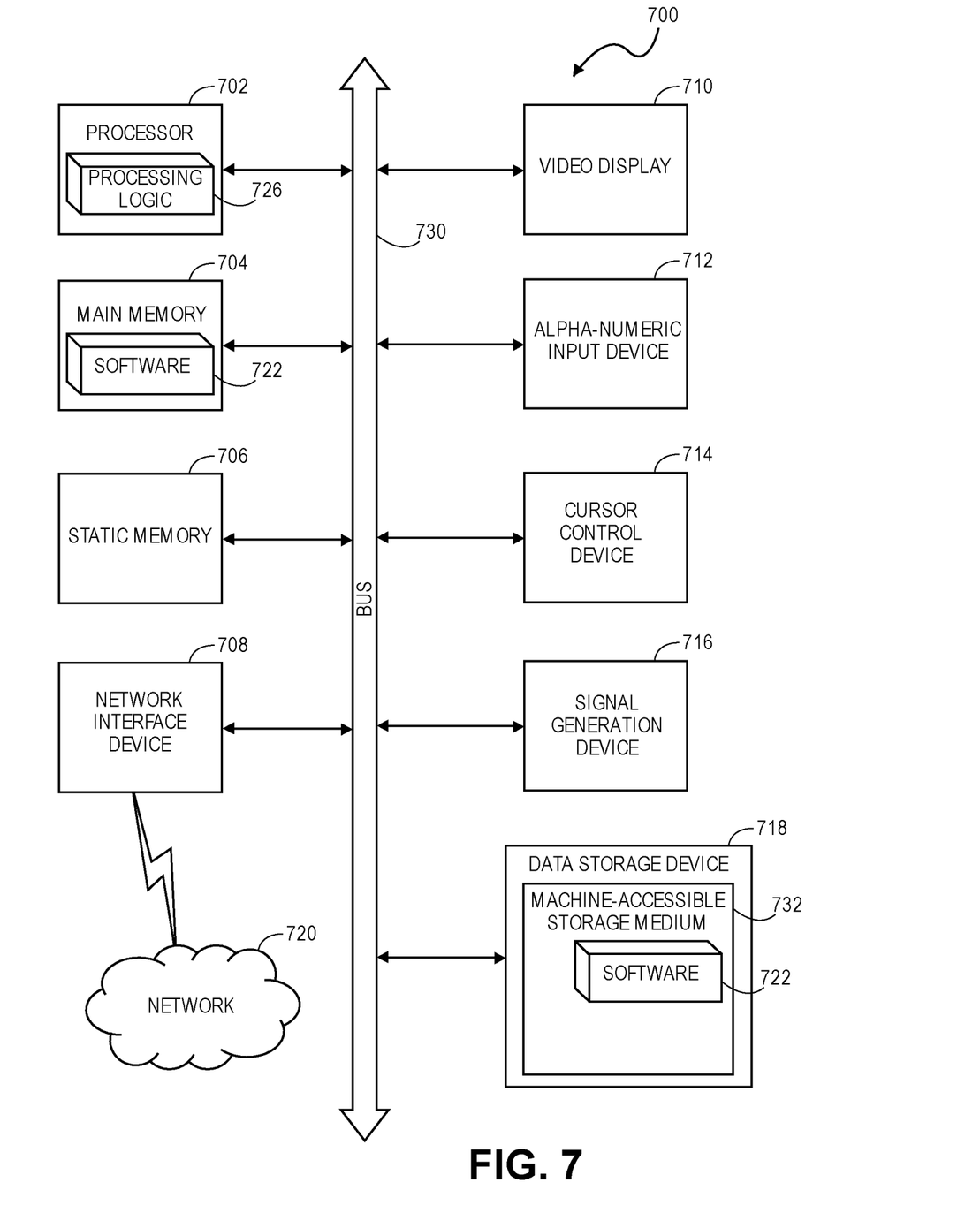
FIG. 7 illustrates a block diagram of an exemplary computer system that may be used in conjunction with a processing tool that includes a DC biased chuck, in accordance with an embodiment.

Referring now to FIG. 7, a block diagram of an exemplary computer system 760 of a processing tool is illustrated in accordance with an embodiment. In an embodiment, computer system 760 is coupled to and controls processing in the processing tool. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool for depositing a film on a workpiece, comprising:
   a chamber body;
   a plasma source, wherein the plasma source is operated in a first mode, and wherein the plasma source induces a plasma from one or more processing gasses which flow into the chamber body;
   a chuck in the chamber body for supporting the workpiece, wherein the chuck comprises conductive pins in a chuck body, the conductive pins comprising aluminum, the conductive pins fixed in the chuck body, and the conductive pins for contacting a backside surface of the workpiece, wherein the conductive pins are electrically coupled to one another in the chuck body and to a DC power source, wherein the conductive pins extend above a top surface of the chuck body such that the workpiece is supported entirely by the conductive pins, wherein the conductive pins do not extend beneath a bottom surface of the chuck body, and wherein the DC power source is operated in a second mode; and
   a computer system including a non-transitory machine readable medium having instructions stored thereon for executing a method, the method comprising:
   flowing the one or more source gasses into the chamber body;
   inducing a plasma from the source gases with the plasma source that is operated in the first mode;
   biasing the workpiece with the DC power source that is operated in the second mode; and
   depositing the film on the workpiece, wherein a temperature of the workpiece is less than 200° C., and wherein the film comprises constituents of only the one or more processing gasses.

2. The processing tool of claim 1, wherein the first mode is different than the second mode.

3. The processing tool of claim 1, wherein the second mode is a pulsed mode, and wherein the second mode comprises alternating a first voltage and a second voltage.

4. The processing tool of claim 1, wherein the second mode is a continuously on mode.

5. The processing tool of claim 1, wherein the first mode comprises a first frequency and a first duty cycle, and wherein the second mode is a pulsed mode that comprises a second frequency and a second duty cycle.

6. The processing tool of claim 5, wherein the first frequency is equal to the second frequency.

7. The processing tool of claim 6, wherein the first duty cycle is equal to the second duty cycle.

8. The processing tool of claim 6, wherein the first duty cycle is different than the second duty cycle.

9. The processing tool of claim 5, wherein the first frequency is different than the second frequency.

10. The processing tool of claim 9, wherein the first duty cycle is the same as the second duty cycle.

11. The processing tool of claim 9, wherein the first duty cycle is different than the second duty cycle.

12. The processing tool of claim 5, wherein the second duty cycle is between 1% and 99%.

* * * * *